United States Defensive Publication [19] (H) [11] T973,008

Kaplan et al. [43] Aug. 1, 1978

[54] METHOD FOR REMOVING LAYERS OF ORGANIC MATERIAL

[75] Inventors: Leon H. Kaplan, Yorktown Heights, N.Y.; Nungavaram S. Viswanathan, Lancaster, Calif.; Steven M. Zimmerman, Wappingers Falls, N.Y.

[73] Assignee: International Business Machines Corporation, Armonk, N.Y.

[21] Appl. No.: 858,985

[22] Filed: Dec. 9, 1977

Related U.S. Application Data

[63] Continuation of Ser. No. 743,190, Nov. 19, 1976, abandoned.

[51] Int. Cl.[2] ..... B08B 3/08

[52] U.S. Cl. ..... 134/3; 134/38

[57] ABSTRACT

Organic materials, such as organic polymer resist layers, are removed from substrates by contacting the materials with a mixture consisting essentially of an alkali metal persulfate and concentrated (96%) sulfuric acid wherein the mixture contains from above about 13 to about 50 grams of alkali metal persulfate per 100 milliliters of sulfuric acid.

9 Claims, No Sheets Drawing,

14 Pages Specification

The file of this unexamined application may be inspected and copies thereof may be purchased (849 O.G. 1221, Apr. 9, 1968).